(12) United States Patent
Chen et al.

(10) Patent No.: US 7,704,813 B2
(45) Date of Patent: Apr. 27, 2010

(54) RELIABLE HIGH-VOLTAGE JUNCTION FIELD EFFECT TRANSISTOR AND METHOD OF MANUFACTURING THEREFOR

(75) Inventors: Kaiyuan Chen, Dallas, TX (US); Joe Trogolo, Plano, TX (US); Tathagata Chatterjee, Allen, TX (US); Steve Merchant, Bedford, NH (US)

(73) Assignee: Texas Instruments Incorporated, Dallas, TX (US)

( * ) Notice: Subject to any disclaimer, the term of this patent is extended or adjusted under 35 U.S.C. 154(b) by 149 days.

(21) Appl. No.: 11/933,909

(22) Filed: Nov. 1, 2007

(65) Prior Publication Data

US 2008/0090346 A1    Apr. 17, 2008

Related U.S. Application Data

(62) Division of application No. 10/956,863, filed on Oct. 1, 2004, now Pat. No. 7,312,481.

(51) Int. Cl.
    *H01L 21/337* (2006.01)
(52) U.S. Cl. .............. 438/186; 438/188; 438/140; 438/454; 257/E29.314
(58) Field of Classification Search ............ 257/134, 257/256, 272, 273, 274, 287, 504, 409, E29.314
    See application file for complete search history.

(56) References Cited

U.S. PATENT DOCUMENTS

| 4,322,738 A | 3/1982 | Bell et al. |
|---|---|---|
| 4,407,005 A | 9/1983 | Bell et al. |
| 4,914,491 A * | 4/1990 | Vu ............................. 257/260 |
| 5,068,705 A | 11/1991 | Tran |
| 5,118,632 A * | 6/1992 | Schrantz ..................... 438/194 |
| 5,382,535 A | 1/1995 | Malhi et al. |
| 5,973,341 A * | 10/1999 | Letavic et al. ............... 257/287 |
| 6,818,490 B2 | 11/2004 | Disney |
| 2004/0036115 A1 * | 2/2004 | Disney ....................... 257/342 |

* cited by examiner

*Primary Examiner*—Sue Purvis
*Assistant Examiner*—Leslie Pilar Cruz
(74) *Attorney, Agent, or Firm*—Jacqueline J. Garner; Wade J. Brady, III; Frederick J. Telecky, Jr.

(57) ABSTRACT

The present invention provides a high-voltage junction field effect transistor (JFET), a method of manufacture and an integrated circuit including the same. One embodiment of the high-voltage junction field effect transistor (JFET) (300) includes a well region (320) of a first conductive type located within a substrate (318) and a gate region (410) of a second conductive type located within the well region (320), the gate region (410) having a length and a width. This embodiment further includes a source region (710) and a drain region (715) of the first conductive type located within the substrate (318) in a spaced apart relation to the gate region (410) and a doped region (810) of the second conductive type located in the gate region (410) and extending along the width of the gate region (410). In place of or addition to the doped region (810), the high-voltage junction field effect transistor (JFET) (300) may includes a conductive field plate (920) located over and extending along the width of the gate region (410).

16 Claims, 9 Drawing Sheets

US 7,704,813 B2

RELIABLE HIGH-VOLTAGE JUNCTION FIELD EFFECT TRANSISTOR AND METHOD OF MANUFACTURING THEREFOR

This is a divisional application of Ser. No. 10/956,863 filed Oct. 1, 2004.

TECHNICAL FIELD OF THE INVENTION

The present invention is directed, in general, to a field effect transistor (FET) and, more specifically, to a high-voltage junction field effect transistor (JFET) and a method of manufacture therefor.

BACKGROUND OF THE INVENTION

There are two basic types of transistors, namely Field Effect Transistors (FETs) and bipolar transistors. In general, current is conducted in FETs by charge carriers (e.g., electrons and holes) typically flowing through one type of semiconductor material, either n-type or p-type materials. In bipolar transistors, current passes in series through both n-type and p-type semiconductor materials.

Within the category of FETS, there are two basic types, namely the Metal Oxide Semiconductor (MOS) FET and the Junction FET (JFET). A primary difference between these two types of transistors is that the gate of the MOSFET has a layer of insulating material, typically referred to as gate oxide, between the gate and the other transistor electrodes. Consequently, channel current in a MOSFET is controlled by the application of electric fields across the channel to enhance and deplete the channel region, as operation requires. The gate of the JFET forms a PN junction with the other electrodes of the transistor, which can be reverse biased by the application of a predetermined gate voltage. Thus, the gate PN junction can be utilized to control the channel current by varying the extent of a depletion region to selectively dimension the current-carrying channel.

There are two different types of JFETs, an n-channel JFET and a p-channel JFET. In the n-channel JFET, carriers are electrons, and in the p-channel JFET carriers are holes. Additionally, the n-channel JFET includes an n-type channel and a p-type gate region, whereas the p-channel JFET includes a p-type channel and an n-type gate region.

JFETs are often employed in start-up circuits (e.g., for telecom and datacom equipment in central offices, PBXs, and servers) where a small current (mA) is supplied from a high (e.g., about 100 V) DC. One example of a schematic for a 110V start-up JFET for a telecom device is shown in FIG. 1. The JFET 100 includes a drain 110, a source 130, and a gate 170. The drain 110 is coupled to an input voltage (Vin) 120, the source 130 coupled to a supply voltage (Vdd) 140 and a bypass capacitor 150 via a voltage drop component 160, and the gate 170 is coupled to a gate control 180.

At the beginning of start-up, the gate control 180 provides a low-impedance path between gate 170 and source 130, giving Vgs near zero. This means that the JFET 100 is on and current will flow into the capacitor 150 and also to any load connected to the source terminal 140. In a typical start-up circuit, the load current is small and most of the current flows into the capacitor 150. The capacitor 150 charges, increasing vdd, which eventually reaches a desired operating value $Vdd_{Op}$. At this point, the low-impedance path between gate 170 and source 130 is opened and a second low-impedance path is turned on between gate 170 and ground. These connections have the effect of reverse biasing the gate-source by $Vdd_{Op}$ volts. If $Vdd_{Op}$ is greater than the JFET pinch-off voltage, Vp, the JFET 100 will be turned off. If Vp exceeds $Vdd_{Op}$, then additional voltage dropping components need to be added in series with the source to increase the magnitude of Vgs, for example diodes or a pnp bipolar transistor.

A JFET without specially designed protection structures will often experience leakage problem or instability at high voltage application. For example, at high voltage charges can spread from high voltage metal leads to low voltage areas along dielectric interfaces. When charges move onto specific regions, such as un-protected gate regions, they may cause surface inversion in certain scenarios. This may turn on a parasitic MOSFET, resulting in leakage. In other scenarios, depending on gate region doping profile, charges may cause instability in channel current.

Accordingly, what is needed in the art is a high-voltage JFET that experiences the benefits of the JFET design without suffering the drawbacks.

SUMMARY OF THE INVENTION

To address the above-discussed deficiencies of the prior art, the present invention provides a high-voltage junction field effect transistor (JFET), a method of manufacture and an integrated circuit including the same. One embodiment of the high-voltage junction field effect transistor (JFET) includes a well region of a first conductive type located within a substrate, and a gate region of a second conductive type located within the well region, the gate region having a length and a width. This embodiment further includes a source region and a drain region of the first conductive type located within the substrate in a spaced apart relation to the gate region and a doped region of the second conductive type located in the gate region and extending along the width of the gate region.

An alternative embodiment of the high-voltage junction field effect transistor (JFET) includes, among other things, a well region of a first conductive type located within a substrate, and a gate region of a second conductive type located within the well region, the gate region having a length and a width. This embodiment further includes a source region and a drain region of the first conductive type located within the substrate in a spaced apart relation to the gate region and a conductive field plate located over the gate region and extending along the width of the gate region.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

Prior Art

DETAILED DESCRIPTION

Figure 1:
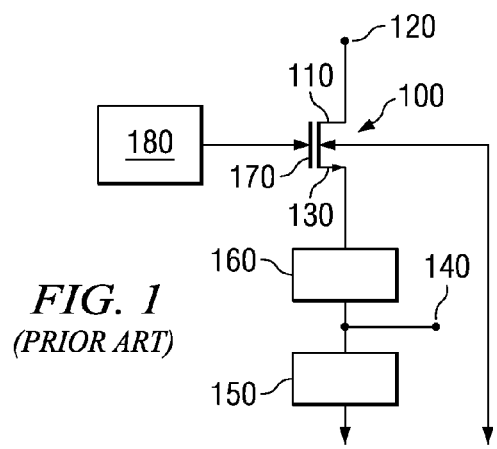
FIG. 1 illustrates a schematic for a 110V start-up JFET for a telecom device.
Figure 2A:
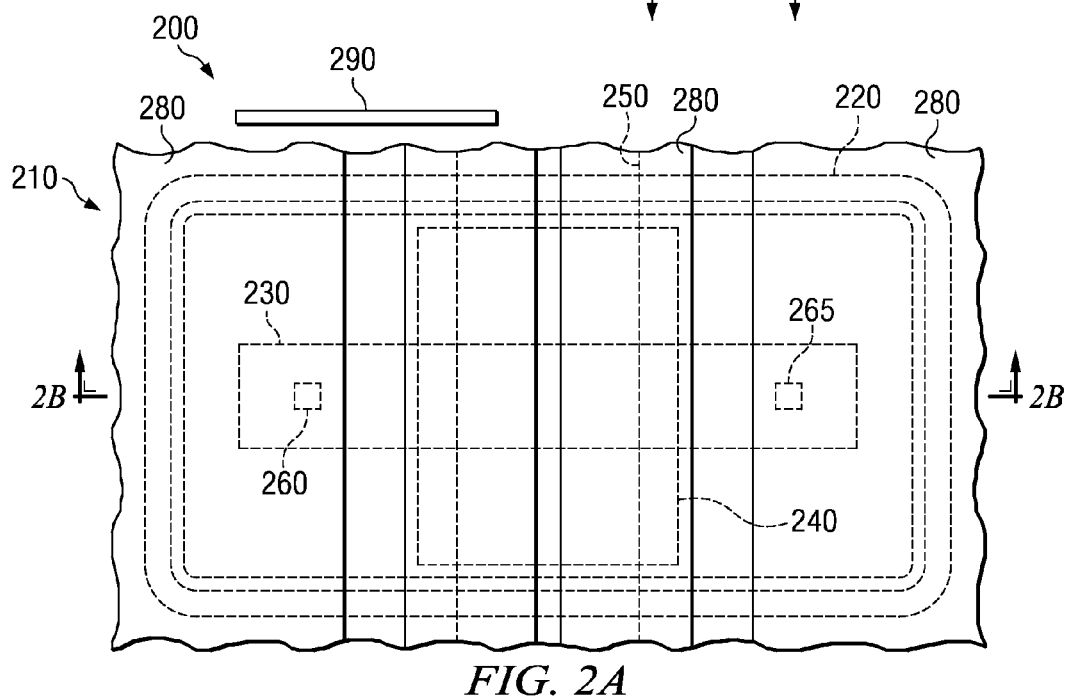
FIGS. 2A and 2B illustrate a top view and a cross-sectional view, respectively, of a completed high-voltage junction field effect transistor (JFET) manufactured in accordance with the principles of the present invention.
Figure 2B:
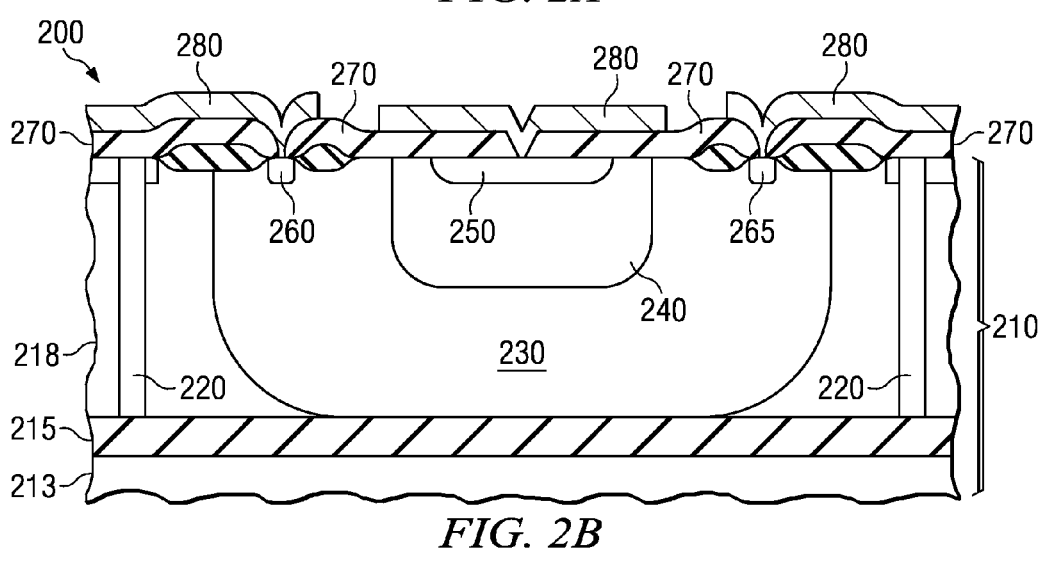

Referring initially to FIGS. 2A and 2B illustrated are a top view and a cross-sectional view, respectively, of a completed high-voltage junction field effect transistor (JFET) 200, manufactured in accordance with the principles of the present invention. The cross-sectional view 2B is taken through the sectional line B-B shown in FIG. 2A. The views illustrated in FIGS. 2A and 2B, as well as the other top views and cross-sectional view illustrated throughout the remainder of this document, will often be described simultaneously, since they are similar in many respects.

For the purpose of completeness, a few terms need to be clarified prior to getting into the details of the present invention. For example, as used herein the term high-voltage JFET corresponds to a JFET configured to operate at voltages greater than about 10 volts, in one advantageous embodiment voltages greater than about 30 volts, in another advantageous embodiment greater than about 50 volts, and in one advantageous embodiment voltages ranging from about 50 volts to about 110 volts. Additionally, as used herein, a width measurement of a feature (e.g., the gate region) refers to a measurement in a direction that is transverse to the flow of current between the drain region and the source region, and a length measurement of a feature (e.g., the gate region) refers to a measurement in a direction that is in the direction of the flow of current between the drain region and the source region.

Turning now to FIGS. 2A and 2B, the high-voltage JFET 200 initially includes a substrate 218. The substrate 218 may be any layer located in a semiconductor device, including a layer located at the wafer level or a layer located above or below wafer level. Nevertheless, in the embodiment illustrated in FIGS. 2A and 2B the substrate 218 forms an upper most layer of a silicon-on-insulator (SOI) structure 210. The SOI structure 210 illustrated in FIGS. 2A and 2B includes a lower most layer 213, a middle dielectric layer 215, and the substrate 218. Both the substrate 218 and the lower most layer 213 in the embodiment of FIGS. 2A and 2B are p-type doped silicon.

Located within the substrate 218 is a conventional trench 220. As is illustrated in FIG. 2A, the trench 220 may surround the JFET structure 200. Located within the substrate 218 and within the boundary of the trench 220 is a well region 230. The well region 230 is doped with a first conductive type that is typically opposite in type from the substrate 218. In the given embodiment of FIGS. 2A and 2B the well region 230 is doped with an n-type dopant. Accordingly, the embodiment shown in FIGS. 2A and 2B is an n-type high voltage JFET. Nevertheless, the dopants discussed herein could be reversed, resulting in a p-type high-voltage JFET. If the JFET 200 illustrated in FIGS. 2A and 2B were to be a p-type high-voltage JFET, the well region 230 would be doped with a p-type dopant, but would typically be included within another well region (not shown) comprising an n-type dopant.

Located within the well region 230 is a gate region 240. The gate region 240, as illustrated in FIGS. 2A and 2B, is doped with a second conductive type. In the illustrative embodiment shown, the gate region 240 is doped with a p-type dopant. Uniquely positioned within the gate region 240 is a doped region 250. The doped region 250, which in one embodiment acts as an anti-inversion region, is positioned such that it extends along the width of the gate region 240. Additionally, as shown, the doped region 250 may extend along the entire width of the gate region 240 and further may form a ring around a periphery of the high-voltage JFET 200. The doped region 250 typically has a higher dopant concentration than the gate region 240 so as to reduce the possibility for surface inversion.

The use and unique position of the doped region 250 substantially reduces the amount of surface inversion along the top surface of the gate region 240. Accordingly, the doped region 250 substantially reduces, if not eliminates, the occurrence of a parasitic leakage caused by the surface inversion. The doped region 250 also reduces distributed series resistance of the gate region 240. Also, the edge of doped region 250 (e.g., length) may be pulled inside of the gate region 240 (e.g., along the length direction) to optimize the gate-to-drain breakdown voltage of the high-voltage JFET 200. Additionally, the doped region 250 forms a heavily doped gate layer that makes ohmic contact to the gate region 240.

Located within the substrate 218, and particularly within the well region 230, in a spaced apart relation to the gate region 240 are a source region 260 and a drain region 265. While the source region 260 and drain region 265 are shown as positioned from left to right across FIG. 2B, those skilled in the art understand that the position of the source region 260 and drain region 265 could easily be swapped. Both the source region 260 and drain region 265 in the embodiment shown contain the first conductive type, which in this instance is an n-type dopant.

Located above the substrate 218, the gate region 240, the source region 260 and the drain region 265 is a dielectric layer 270. Further, uniquely positioned above and extending along the width of the gate region 240 is a conductive field plate 280.

In the illustrative embodiment shown, the conductive field plate 280 extends along the entire width of the gate region 240 and beyond a perimeter of the trench 220. As further shown, the conductive field plate 280 may be formed of three portions, a first portion being located above the gate region 240 as previously described, a second portion located over the source region 260 and a third portion located over the drain region 265. The first, second and third portions of the conductive field plate 280 work together to substantially reduce the aforementioned charge spreading problem.

In the illustrative embodiment shown in FIGS. 2A and 2B the conductive field plate 280 comprises a metal. Nevertheless, the conductive field plate 280 could comprise a conductive material that is not a metal and stay within the scope of the present invention. The conductive field plate 280, protects the gate region 240 from the charge spreading. Accordingly, the conductive field plate 280 substantially reduces, if not eliminates, the occurrence of a parasitic leakage caused by the surface inversion. When either of the doped region 250 or conductive field plate 280 are used alone they provide improved results, however, when the doped region 250 and conductive field plate 280 are used together they provide exemplary results.

Also shown in FIGS. 2A and 2B is a high-voltage conductor 290. The high-voltage conductor 290 shown is located proximate the source region 260 and the gate region 240. Advantageously, the conductive field plate 280 shields the gate region 240 from charges generated by the high-voltage conductor 290.

Figure 3A:
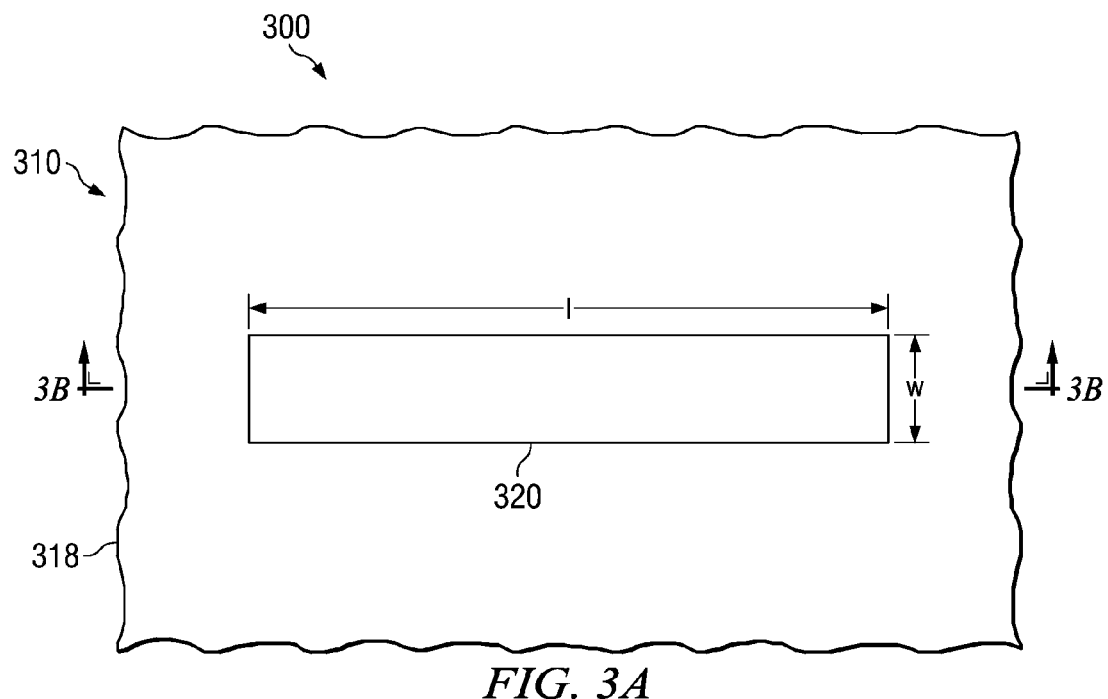
FIGS. 3A and 3B illustrate a plan view and a cross-sectional view, respectively, of a partially completed high-voltage JFET.

Turning now to FIGS. 3A-9B, illustrated are various views of detailed manufacturing steps instructing how one might, in an advantageous embodiment, manufacture a high-voltage JFET similar to the high-voltage JFET 200 depicted in FIGS. 2A and 2B. FIGS. 3A and 3B illustrate a plan view and a cross-sectional view, respectively, of a partially completed high-voltage JFET 300. The partially completed high-voltage JFET 300 of FIG. 2 includes a substrate 318. The substrate 318 may, in an exemplary embodiment, be any layer located in the partially completed high-voltage JFET 300, including a wafer itself or a layer located above the wafer (e.g., epitaxial layer).

Figure 3B:
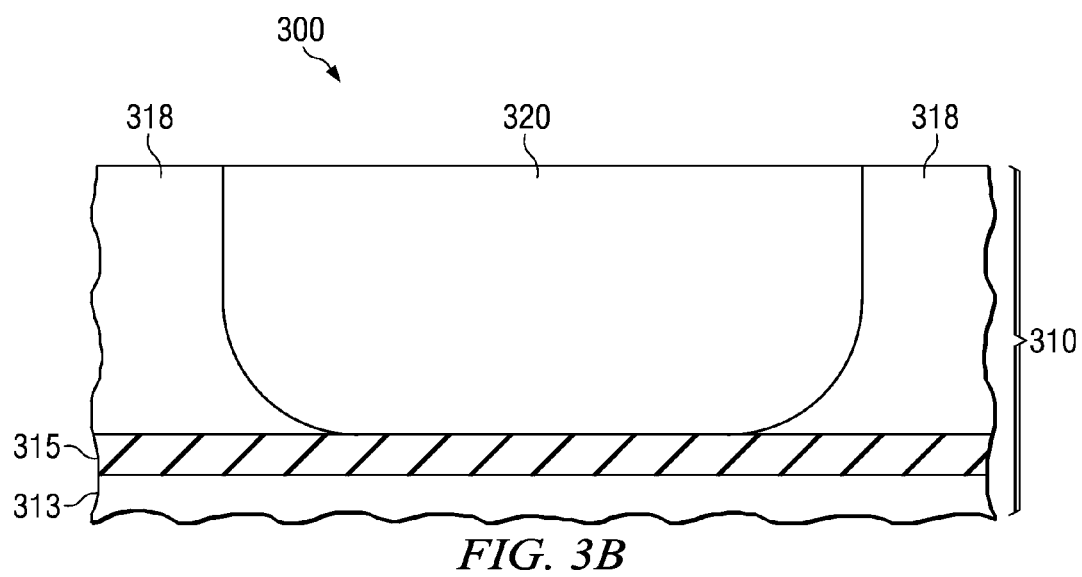

As illustrated in FIGS. 3A and 3B, the substrate 318 may form a portion of a SOI structure 310. For example, the SOI structure 310 could include the substrate 318, which acts as the upper most layer, a center dielectric layer 315, and a lower most layer 313, which may act as a second gate region. In an exemplary embodiment, the substrate 318 might have a thickness ranging from about 5 μm to about 7 μm and be formed of (100) silicon. The center dielectric layer 315, on the other hand, might have a thickness ranging from about 0.5 μm to about 1.5 μm and be formed of an oxide. Likewise, the lower most layer 313 would generally have a thickness equal to a conventional semiconductor wafer and again be formed of (100) silicon. While thicknesses and material types have been given for the substrate 318, center dielectric layer 315 and the lower most layer 313, those skilled in the art appreciate that these values and materials may be easily altered to meet a specific design parameter of the JFET 300 without departing from the scope of the present invention.

In the embodiment illustrated in FIGS. 3A and 3B, both the substrate 318 and lower most layer 313 are p-type doped. In an exemplary embodiment both the substrate 318 and the lower most layer 313 would be doped so as to have a resistance ranging from about 20 Ω-cm to about 30 Ω-cm. These values may, nonetheless, be tailored to values outside of this range. It should go without noting that the substrate 318 and/or lower most layer 313 could be n-type substrates without departing from the scope of the present invention. In such a case, each of the dopant types described throughout the remainder of this document would be reversed. For clarity, no further reference to this opposite scheme will be discussed.

In the illustrative embodiment of FIGS. 3A and 3B, formed within the substrate 318 is a well region 320. The well region 320, in light of the p-type substrate 318, would more than likely contain an n-type dopant. For example, the well region 320 would likely be doped with an n-type dopant dose ranging from about $1E12$ atoms/cm$^2$ to about $8E12$ atoms/cm$^2$ and at a power ranging from about 100 keV to about 300 keV. What generally results in the well region 320 having a peak dopant concentration ranging from about $8E14$ atoms/cm$^3$ to about $8E15$ atoms/cm$^3$. As shown, in an exemplary embodiment the well region 320 extends through the substrate 318 and to the middle dielectric layer 315. Other doses, powers, peak dopant concentrations and locations could conceivably be used.

As the terms are used herein, the well region 320 would typically have a length (l) ranging from about 35μm to about 150 μm, and preferably about 68 μm, and a width (w) ranging from about 5 μm to about 35 μm, and preferably about 12 μm. Obviously, these values may scale as the overall size of the high-voltage JFET 300 scales in future devices. Further, the length (l) and width (w) of the well region 320 may not scale at the same rate for these future devices.

Figure 4A:
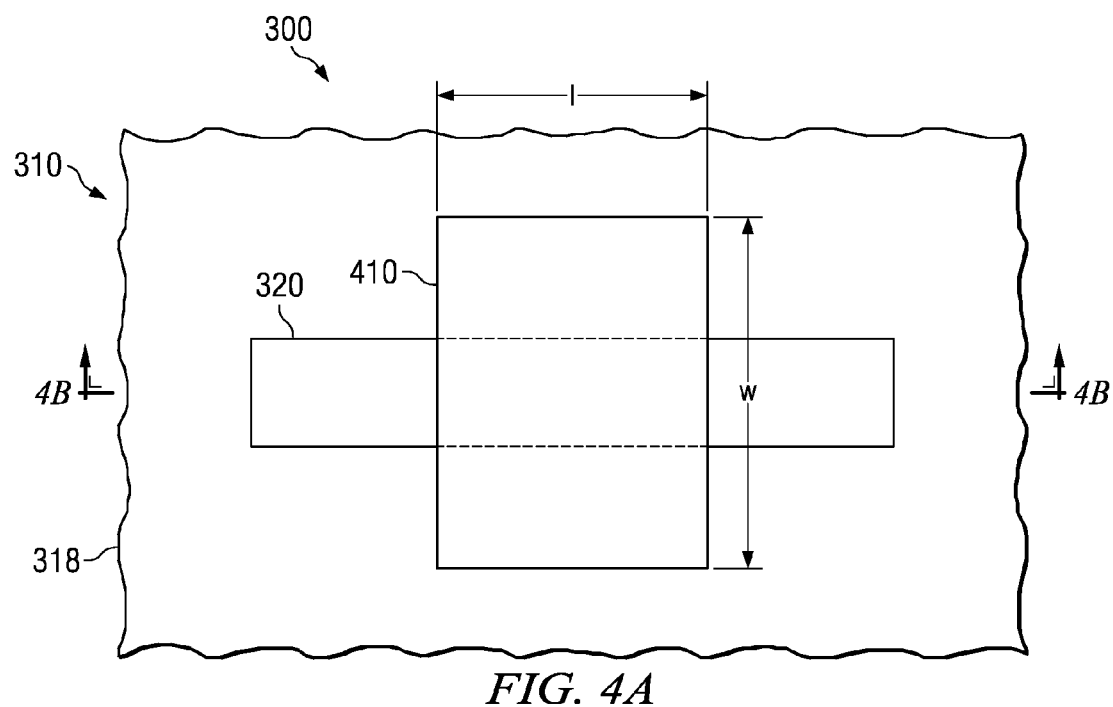
FIGS. 4A and 4B illustrate a plan view and a cross-sectional view, respectively, of the partially completed high-voltage JFET illustrated in FIGS. 3A and 3B after forming a gate region within the well region.
Figure 4B:
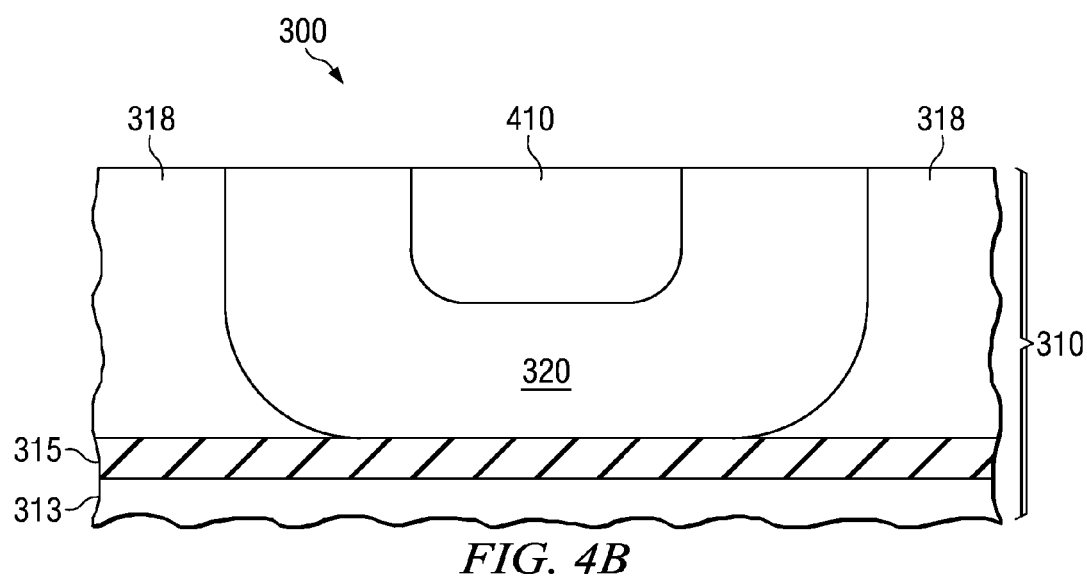

Turning now to FIGS. 4A and 4B, illustrated are a plan view and a cross-sectional view, respectively, of the partially completed high-voltage JFET 300 illustrated in FIGS. 3A and 3B after forming a gate region 410 within the well region 320. The gate region 410, in light of the n-type doped well region 320, would most likely contain a p-type dopant. For example, the gate region 410 would likely be doped with a p-type dopant dose ranging from about $3E12$ atoms/cm$^2$ to about $3E13$ atoms/cm$^2$ and at a power ranging from about 20 keV to about 100 keV. What generally results is the gate region 410 having a peak dopant concentration ranging from about $1E16$ atoms/cm$^3$ to about $1E17$ atoms/cm$^3$, and preferably a value of about $4E16$ atoms/cm$^3$. As shown, in an exemplary embodiment the gate region 410 extends into the well region 320 by about 3 μm. This value will vary according to the specific device. Again, other doses, powers, peak dopant concentrations and locations could conceivably be used to form the gate region 410.

As the terms are used herein, the gate region 410 would typically have a length (l) ranging from about 10 μm to about 100 μm, and preferably about 30 μm, and a width (w) ranging from about 10 μm to about 60 μm, and preferably about 30 μm. Again, these values may scale as the overall size of the high-voltage JFET 300 scales in future devices. Further, the length (l) and width (w) of the gate region 410 may not scale at the same rate for these future devices.

Figure 5A:
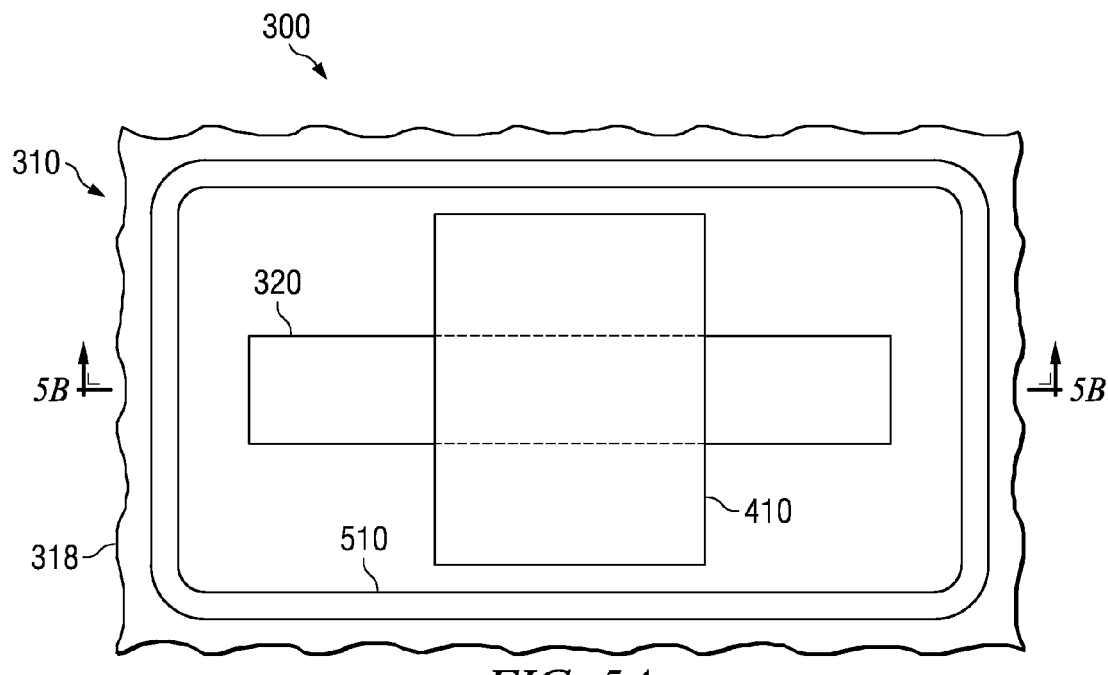
FIGS. 5A and 5B illustrate a plan view and a cross-sectional view, respectively, of the partially completed high-voltage JFET illustrated in FIGS. 4A and 4B after forming a trench within the substrate.
Figure 5B:
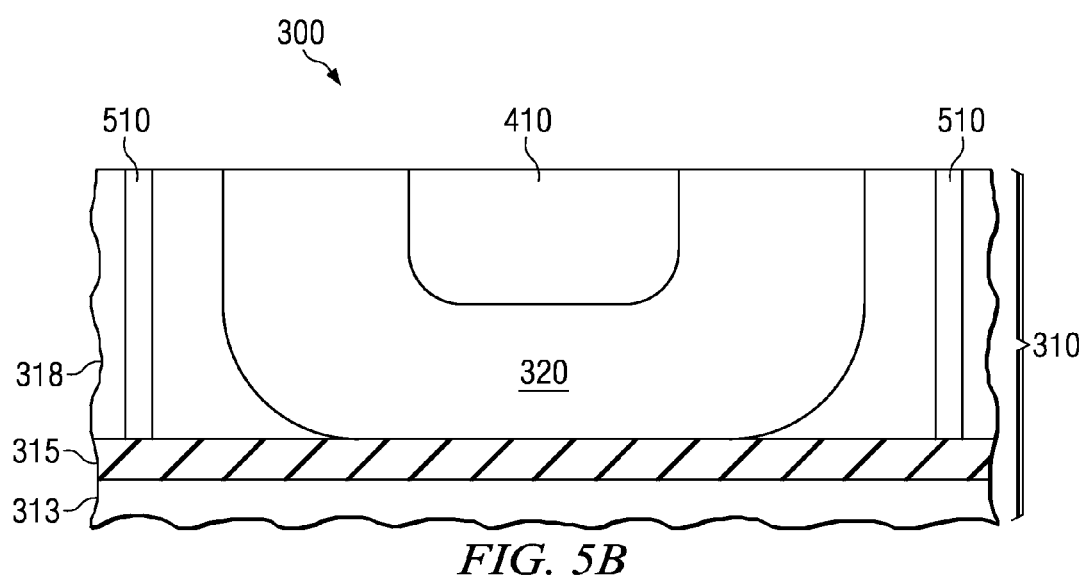

Turning now to FIGS. 5A and 5B, illustrated are a plan view and a cross-sectional view, respectively, of the partially completed high-voltage JFET 300 illustrated in FIGS. 4A and 4B after forming a trench 510 within the substrate 318. As illustrated in FIG. 5A, the trench 510 surrounds the gate region 410 in this particular embodiment. Those skilled in the art understand the standard processes that may be used to form the trench 510 within the substrate 318. In one embodiment, however, a patterned photoresist layer, followed by a conventional trench etch could be used to form an opening of the trench 510. Thereafter, a conventional trench oxidation, trench liner deposition, and trench fill could be used to complete the trench 510. In the exemplary embodiment of FIGS. 5A and 5B, the trench 510 extends entirely through the substrate 318 (e.g., about 7 μm) and contains polysilicon as the trench fill material. Other conventional trenches 510 could be used without departing from the scope of the present invention.

Figure 6A:
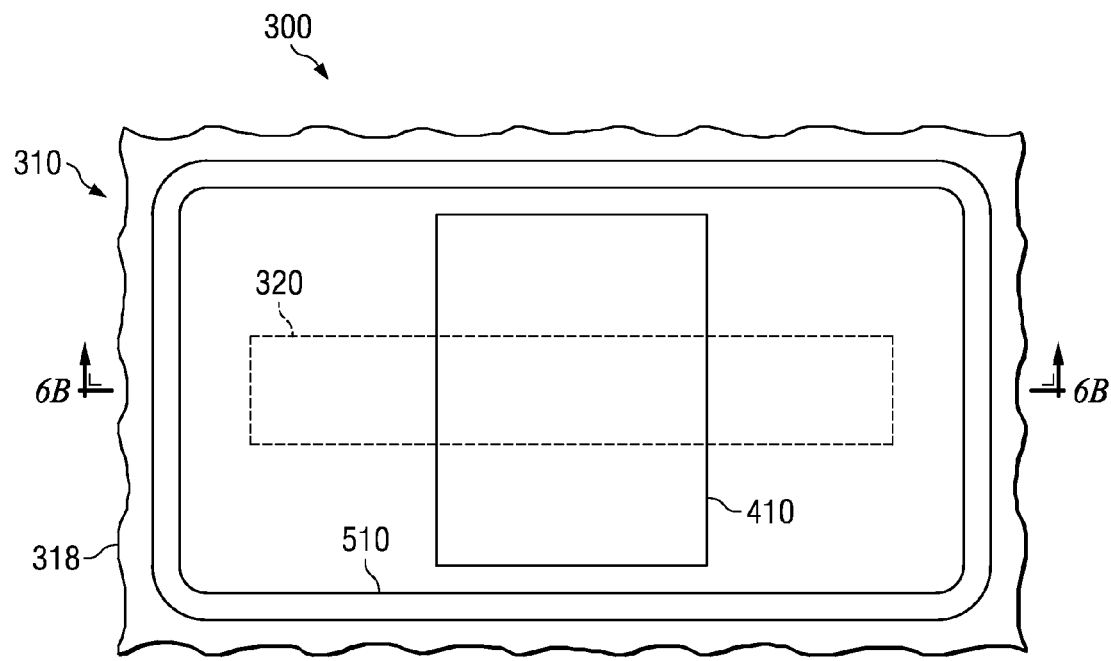
FIGS. 6A and 6B illustrate a plan view and a cross-sectional view, respectively, of the partially completed high-voltage JFET illustrated in FIGS. 5A and 5B after forming isolation structures at the surface of the substrate.
Figure 6B:
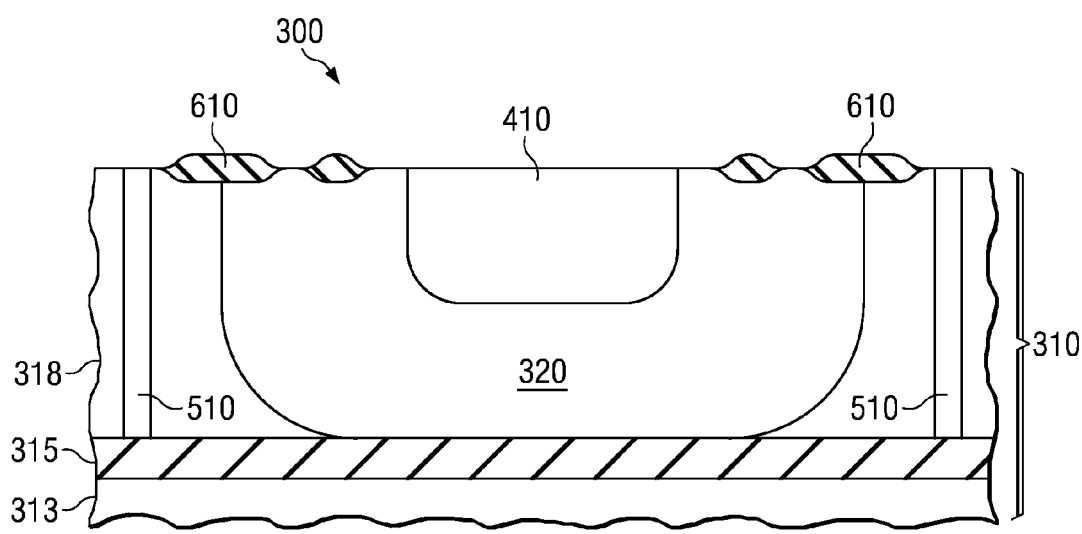

Turning now to FIGS. 6A and 6B, illustrated are a plan view and a cross-sectional view, respectively, of the partially completed high-voltage JFET 300 illustrated in FIGS. 5A and 5B after forming field oxides 610 at the surface of the substrate 318. The field oxides 610 illustrated in FIGS. 6A and 6B happen to be LOCOS field oxides, however, other field oxides could be used without departing from the scope of the present invention. As the formation of field oxides 610 is well-known in the art, not further detail is warranted.

In addition to forming the field oxides 610 in FIGS. 6A and 6B, other features (not shown) may also be formed at this stage of manufacture. As only an example, both an n-channel stop implant and p-channel stop implant could also be formed at this stage of manufacture. It should be noted that the field oxides 610 are optional, and if they were omitted the n-channel stop implant and p-channel stop implant could also be omitted.

Figure 7A:
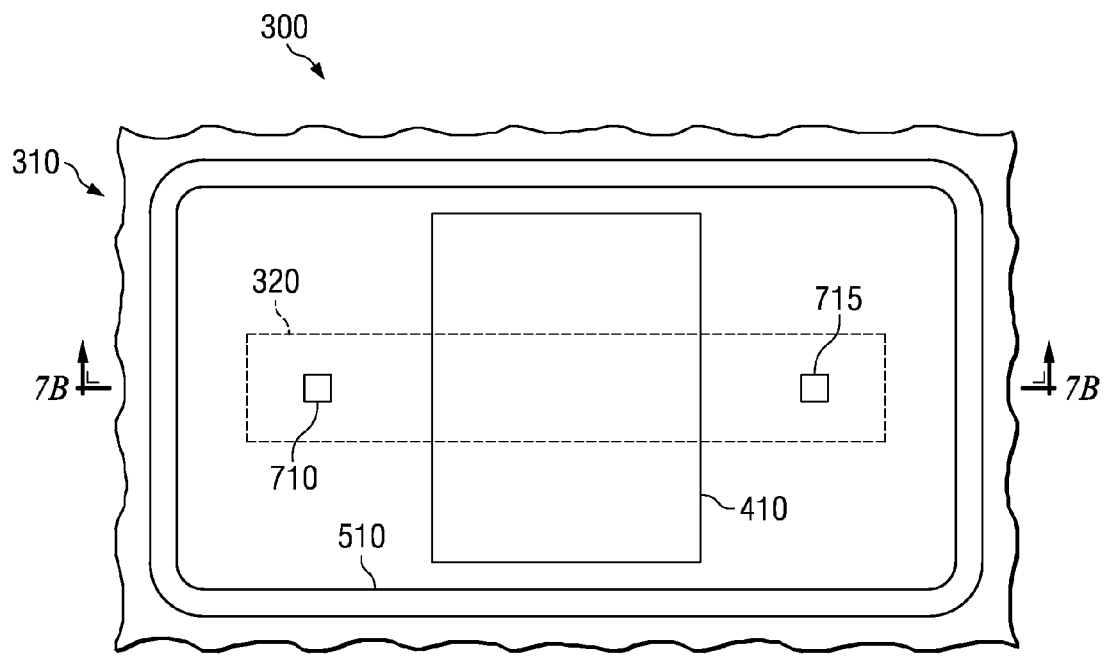
FIGS. 7A and 7B illustrate a plan view and a cross-sectional view, respectively, of the partially completed high-voltage JFET illustrated in FIGS. 6A and 6B after forming one or more portions of a source region and a drain region.
Figure 7B:
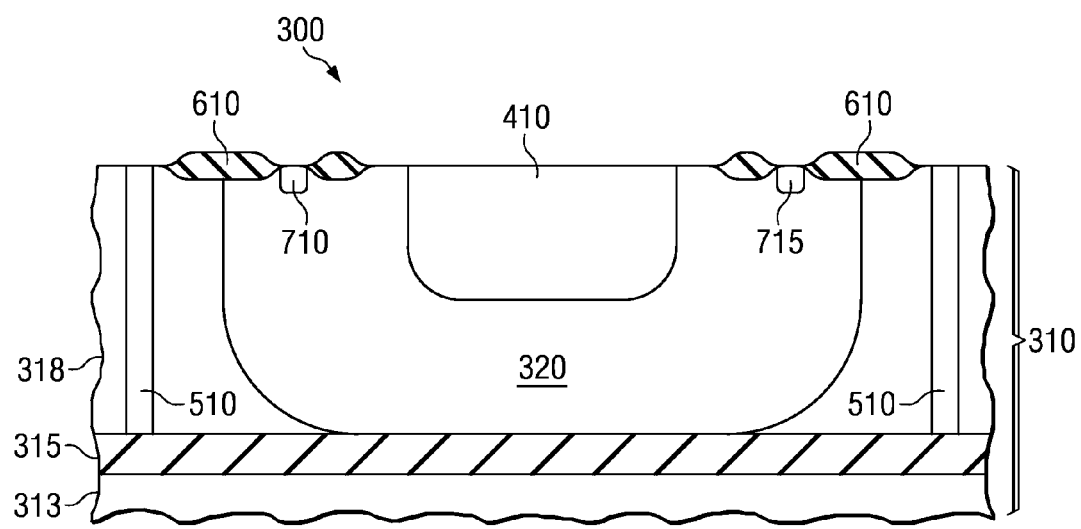

Turning now to FIGS. 7A and 7B, illustrated are a plan view and a cross-sectional view, respectively, of the partially completed high-voltage JFET 300 illustrated in FIGS. 6A and 6B after forming one or more portions of a source region 710 and a drain region 715. The source region 710 and drain region 715, in light of the n-type doped well region 320, would most likely contain an n-type dopant. For example, the source region 710 and drain region 715 would likely be doped with one or more n-type dopants, such as one or both of phosphorous and arsenic. If both were used, the phosphorous could be implanted using a dose ranging from about 2E14 atoms/cm$^2$ to about 1E15 atoms/cm$^2$ and a power ranging from about 75 keV to about 200 keV, and the arsenic could be implanted using a dose ranging from about 1E15 atoms/cm$^2$ to about 1E16 atoms/cm$^2$ and a power ranging from about 75 keV to about 250 keV. The concentration of the phosphorous and arsenic in the source region 710 and drain region 715 would vary accordingly. As shown, in an exemplary embodiment the source region 710 and drain region 715 each extend into the well region 320 by about 0.5 µm. This value will vary according to the specific device. Again, other doses, powers, peak dopant concentrations and locations could conceivably be used to form the source region 710 and drain region 715.

What have been described in FIGS. 7A and 7B as the source region 710 and drain region 715 actually typically only form a portion of the source region 710 and drain region 715. Specifically, the source region 710 and drain region 715 are more like source and drain contacts for the regions therebelow. Nevertheless, they form at least a portion of the actual source and drain regions.

The spacing between drain region 715 and the edge of the gate region 410 is important for breakdown voltage. In the embodiment of FIGS. 7A and 7B the spacing is about 13 µm to achieve 110V minimum breakdown voltage between drain region 715 and gate region 410, and the drain region 715 to the source region 710. Nevertheless, the spacing can vary depending on doping profile and with or without field oxide 610. The spacing between source region 710 and edge of gate region 410 is not as important. In the embodiment shown the high-voltage JFET 300 is a symmetric device, the spacings being the same, however, one skilled in the art could reduce the spacing between source region 710 and the edge of gate region 410 to make an asymmetric device and stay within the scope of the present invention. In the embodiment of FIGS. 7A and 7B, the doping profile of the well region 320 and the gate region 410, in conjunction with the spacing between the drain region 715 and the gate region 410 edge (with or without field oxide) make the high-voltage JFET 300 to have a minimum breakdown voltage of about 110V.

Figure 8A:
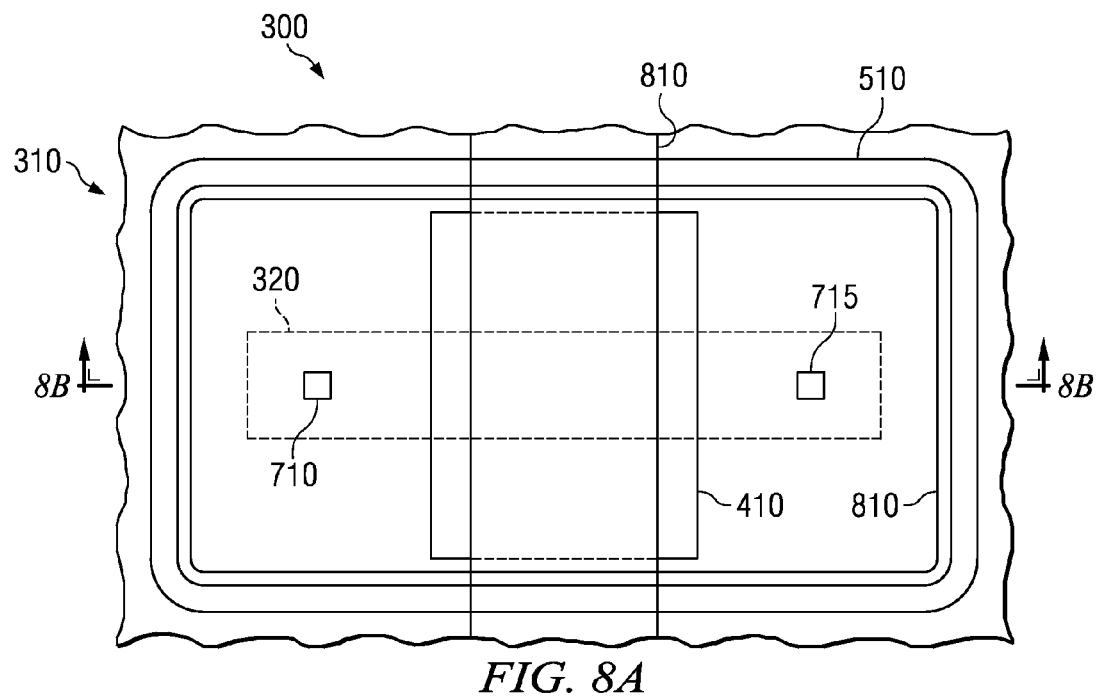
FIGS. 8A and 8B illustrate a plan view and a cross-sectional view, respectively, of the partially completed high-voltage JFET illustrated in FIGS. 7A and 7B after forming a doped region within the substrate.
Figure 8B:
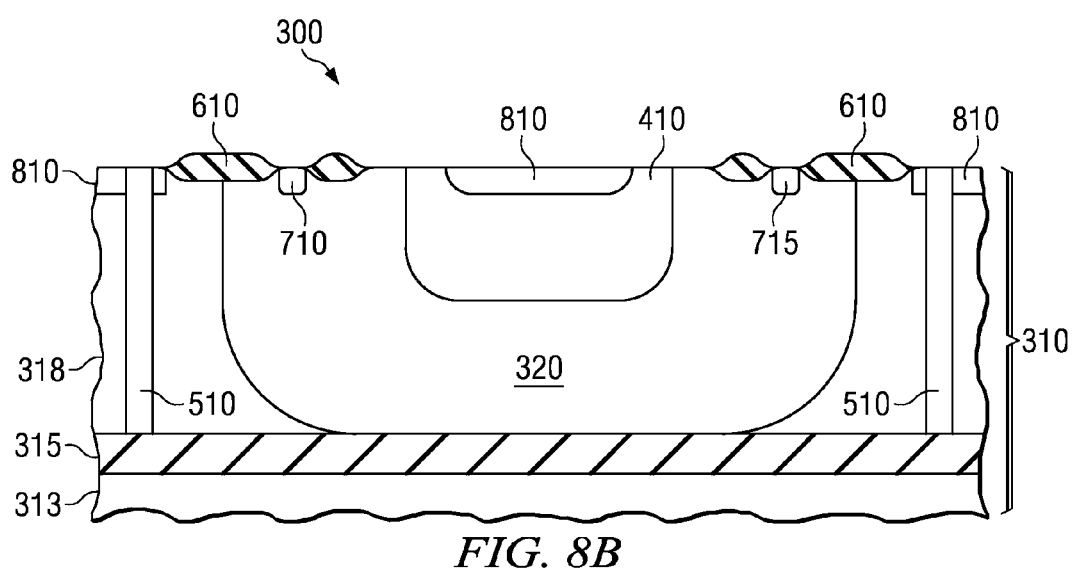

Turning now to FIGS. 8A and 8B, illustrated are a plan view and a cross-sectional view, respectively, of the partially completed high-voltage JFET 300 illustrated in FIGS. 7A and 7B after forming a doped region 810 within the substrate 318. In the particular embodiment illustrated in FIGS. 8A and 8B, the doped region 810 is predominantly located within the gate region 410. The location of the doped region 810 is considered paramount to its effectiveness. For example, while the length of the doped region 810 is not as important, the doped region 810 should at least extend along the width of the gate region 410, if not along the entire width of the gate region 410. In one advantageous embodiment, providing possibly the best results, the doped region 810 extends along the entire width of the gate region 410 and also forms a ring around a periphery of the high-voltage JFET 300, as shown in FIG. 8A. The ring portion of the doped region 810 is thought to help reduce surface inversion near a periphery of the high-voltage JFET 300, eliminating any possible leakage current path on the top silicon surface.

The doped region 810, in light of the p-type doped gate region 410 and the desire to prevent surface inversion, would most likely contain a p-type dopant. For example, the doped region 810 would likely be doped with a p-type dopant dose ranging from about 1E15 atoms/cm$^2$ to about 1E16 atoms/cm$^2$ and at a power ranging from about 10 keV to about 60 keV. What generally results is the doped region 810 having a peak dopant concentration of greater than about 1E19 atoms/cm$^3$, and preferably a value of about 6E19 atoms/cm$^3$. As shown, in an exemplary embodiment the doped region 810 extends into the substrate 318 by about 0.5 µm. This value will vary according to the specific device. Again, other doses, powers, peak dopant concentrations and locations could conceivably be used to form the doped region 810.

Figure 9A:
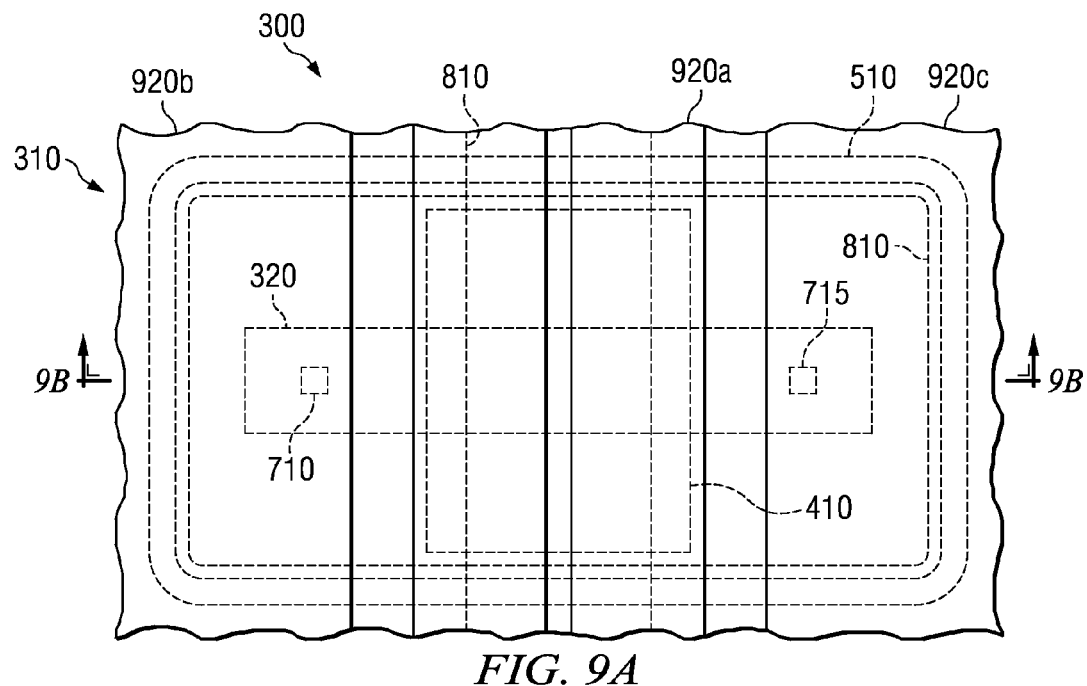
FIGS. 9A and 9B illustrate a plan view and a cross-sectional view, respectively, of the partially completed high-voltage JFET illustrated in FIGS. 8A and 8B after forming a dielectric layer over the substrate and a conductive field plate over at least the gate region.
Figure 9B:
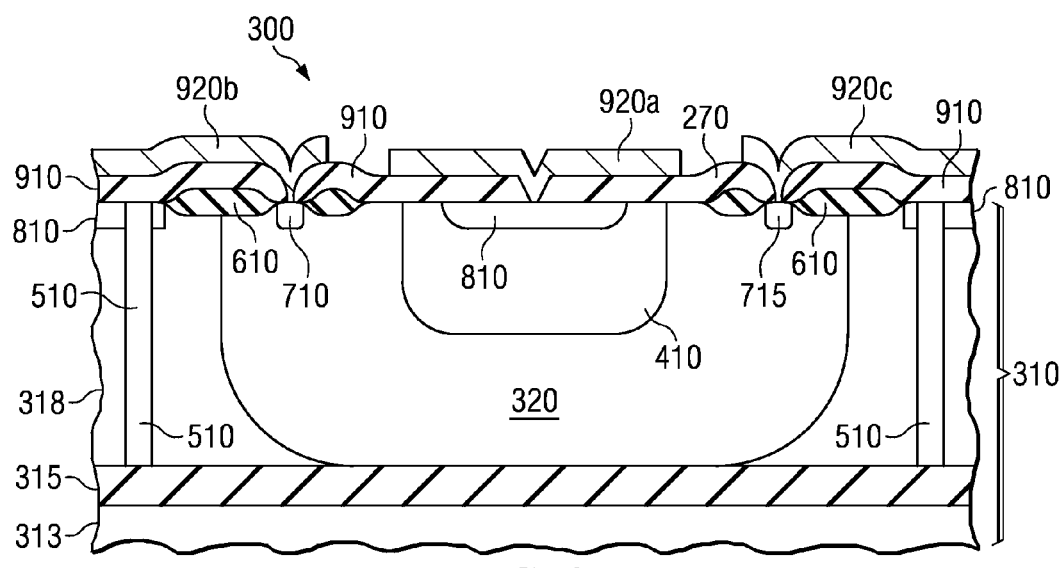

Turning now to FIGS. 9A and 9B, illustrated are a plan view and a cross-sectional view, respectively, of the partially completed high-voltage JFET 300 illustrated in FIGS. 8A and 8B after forming a dielectric layer 910 over the substrate 318 and a conductive field plate 920 over at least the gate region 410. The dielectric layer 910 may be any dielectric layer currently known or hereafter discovered and used for insulation purposes in a semiconductor device. In the exemplary embodiment of FIGS. 9A and 9B, however, the dielectric layer 910 comprises a dual layer dielectric layer 910. The first layer, in the advantageous embodiment disclosed, includes an almost 0.2 µm NSG layer, and the second layer, in the advantageous embodiment disclosed, includes an almost 0.8 µm BPSG layer. The resulting dielectric layer 910 approaches about 1.0 µm thick. Other materials and thicknesses could, nonetheless, be used for the dielectric layer 910.

As previously mentioned, located over the gate region 410, and in this instance over the dielectric layer 910, is the conductive field plate 920. Similar to the doped region 810, the particular placement of the conductive field plate 920 is important. At the very least, the conductive field plate 920 should be located over and extending along the width of the gate region 410. In an exemplary embodiment, the conductive field plate 920 extends along the entire width of the gate region 410 and beyond a perimeter of the trench 510, such as shown by the first portion 920a. A length of the first portion 920a optimally extends at least a portion past a length of the gate region 410. In addition to the first portion 920a, a second portion 920b of the conductive field plate 920 may be located over the source region 710 and a third portion 920c of the conductive field plate 920 may be located over the drain region 715. In an exemplary embodiment, the second and third portions 920b, 920c, of the conductive field plates 920 have widths coextensive with a width of the first portion 920a of the conductive field plate 920.

Those skilled in the art understand the process for forming the conductive field plate 920. In one advantageous embodiment, openings are formed in the dielectric layer 910 where contact to the source region 710, gate region 410 and drain region 715 are desired, and then a blanket layer of conductive material, such as a metal, is formed over the dielectric layer 910 and in the openings. The blanket layer of conductive material may then be conventionally patterned, resulting in the conductive field plate 920 remaining at the desired locations. What results after the formation of the conductive field plate 920 is a device similar to the completed high-voltage JFET 200 illustrated in FIG. 2.

Figure 10:
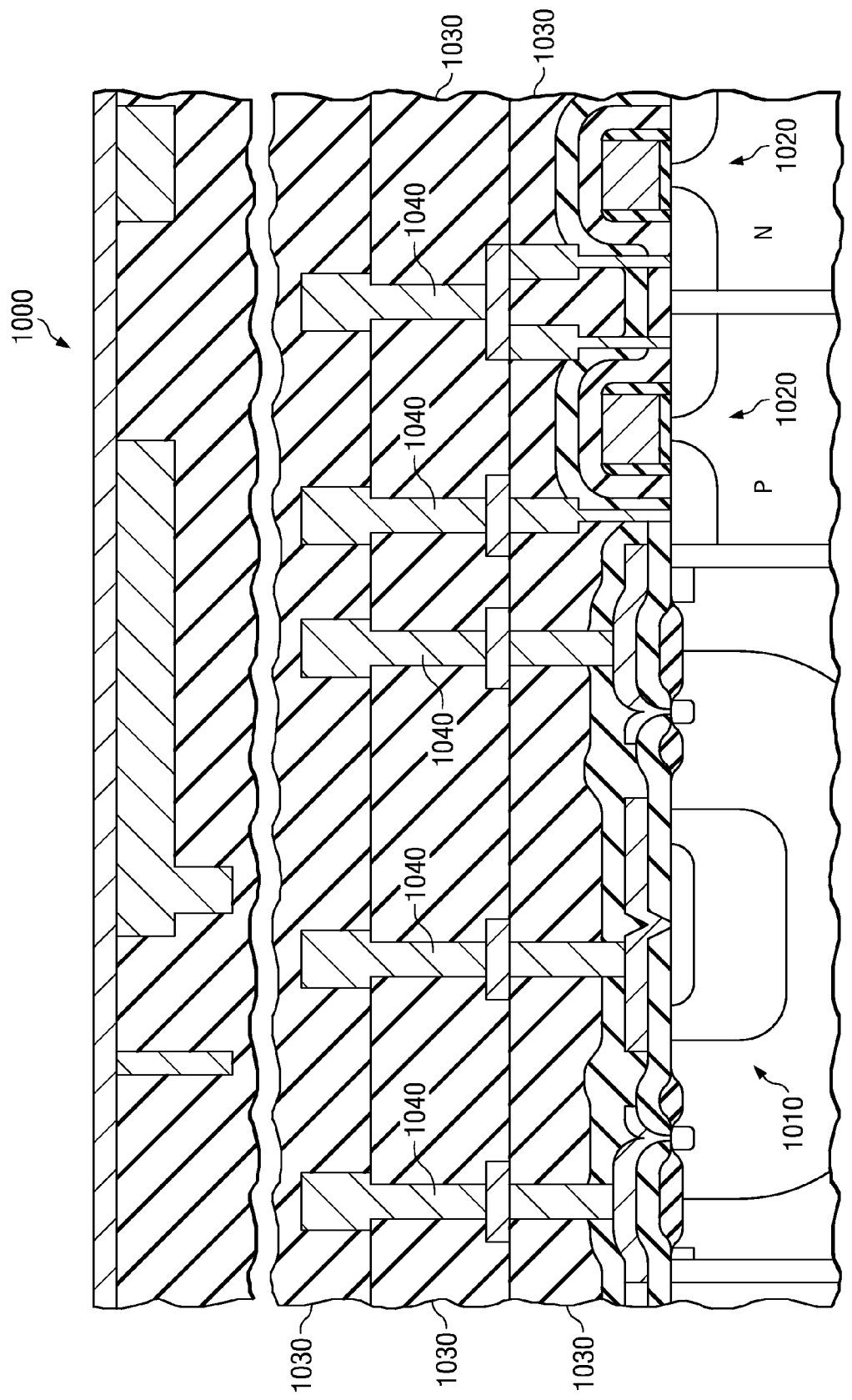
FIG. 10 illustrates an exemplary cross-sectional view of a conventional integrated circuit (IC) incorporating one or more high-voltage JFET devices constructed according to the principles of the present invention.

Referring finally to FIG. 10, illustrated is an exemplary cross-sectional view of a conventional integrated circuit (IC) 1000 incorporating one or more high-voltage JFET devices 1010 constructed according to the principles of the present invention. The IC 1000 may also include other devices, such as transistors used to form CMOS devices, BiCMOS devices, Bipolar devices, as well as capacitors or other types of devices. The IC 1000 may also include passive devices, such as inductors or resistors, or it may also include optical devices or optoelectronic devices. Those skilled in the art are familiar with these various types of devices and their manufacture. In the particular embodiment illustrated in FIG. 10, the IC 1000 includes the high-voltage JFET device 1010, and Metal Oxide Semiconductor (MOS) FET devices 1020 having dielectric layers 1030 located there over. Additionally, interconnect structures 1040 are located within the dielectric layers 1030 to interconnect various devices, thus, forming the operational integrated circuit 1000.

Although the present invention has been described in detail, those skilled in the art should understand that they can make various changes, substitutions and alterations herein without departing from the spirit and scope of the invention in its broadest form.

What is claimed is:

1. A method for manufacturing a high-voltage junction field effect transistor (JFET), comprising:
    placing a well region of a first conductive type within a substrate;
    placing a gate region of a second conductive type within the well region, the gate region having a length and a width;
    placing a source region and a drain region of the first conductive type within the substrate in a spaced apart relation to the gate region; and
    forming a doped region of the second conductive type in the gate region and extending along the width of the gate region.

2. The method as recited in claim 1 wherein the doped region extends along the entire width of the gate region.

3. The method as recited in claim 1 wherein the doped region forms a ring around a periphery of the high-voltage junction field effect transistor (JFET).

4. The method as recited in claim 1 wherein the gate region has a peak second conductive type dopant concentration ranging from about 1E16 atoms/cm$^3$ to about 1E17 atoms/cm$^3$ and the doped region has a peak second conductive type dopant concentration of greater than about 1E19 atoms/cm$^3$.

5. The method as recited in claim 1 further including forming a conductive field plate over the gate region and extending along the width of the gate region.

6. The method as recited in claim 1 wherein the second type dopant is a p-type dopant thereby making the high-voltage junction field effect transistor (JFET) an n-type high-voltage junction field effect transistor (JFET).

7. The method as recited in claim 1 wherein the substrate forms an upper most layer of a silicon on insulator (SOI) structure.

8. The method as recited in claim 7 wherein the gate region is a first gate region and wherein a lower most layer of the silicon on insulator (SOI) structure forms a second gate region.

9. A method for manufacturing a high-voltage junction field effect transistor (JFET), comprising:
    placing a well region of a first conductive type within a substrate;
    placing a gate region of a second conductive type within the well region, the gate region having a length and a width;
    placing a source region and a drain region of the first conductive type within the substrate in a spaced apart relation to the gate region; and
    forming a conductive field plate over and extending along the width of the gate region.

10. The method as recited in claim 9 further including forming a high-voltage conductor proximate the source region and the gate region, wherein the conductive field plate shields the gate region from charges generated by the high-voltage conductor.

11. The method as recited in claim 9 further including forming a doped region of the second conductive type in the gate region and extending along the width of the gate region.

12. The method as recited in claim 9 wherein the second type dopant is a p-type dopant thereby making the high-voltage junction field effect transistor (JFET) an n-type high-voltage junction field effect transistor (JFET).

13. The method as recited in claim 9 wherein the substrate forms an upper most layer of a silicon on insulator (SOI) structure.

14. The method as recited in claim 13 wherein the gate region is a first gate region and wherein a lower most layer of the silicon on insulator (SOI) structure forms a second gate region.

15. A method for manufacturing a high-voltage junction field effect transistor (JFET), comprising:
    placing a well region of a first conductive type within a substrate;
    placing a gate region of a second conductive type within the well region, the gate region having a length and a width;
    placing a source region and a drain region of the first conductive type within the substrate in a spaced apart relation to the gate region;
    forming a conductive field plate over and extending along the width of the gate region; and
    forming a trench surrounding the gate region, wherein the conductive field plate extends along the entire width of the gate region and beyond a perimeter of the trench.

16. The method as recited in claim 15 wherein the conductive field plate is a first portion of a conductive field plate, and wherein a second portion of the conductive field plate is located over the source region and a third portion of the conductive field plate is located over the drain region, the second and third portions of the conductive field plates having widths coextensive with a width of the first portion of the conductive field plate.

* * * * *